United States Patent
Vijayaraghavan et al.

(10) Patent No.: US 8,010,310 B2
(45) Date of Patent: Aug. 30, 2011

(54) METHOD AND APPARATUS FOR IDENTIFYING OUTLIERS FOLLOWING BURN-IN TESTING

(75) Inventors: Rajesh Vijayaraghavan, Austin, TX (US); Benjamin Ertle, Austin, TX (US); James E. Routh, Austin, TX (US); Paul A. Ferno, Dripping Springs, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 829 days.

(21) Appl. No.: 11/829,203

(22) Filed: Jul. 27, 2007

(65) Prior Publication Data

US 2009/0027077 A1    Jan. 29, 2009

(51) Int. Cl.
*G01R 27/28*    (2006.01)
*G01R 31/26*    (2006.01)

(52) U.S. Cl. ............................. 702/117; 438/14; 702/81

(58) Field of Classification Search ............... 702/81, 702/83, 108, 117, 118, 179, 183; 324/755, 324/763, 765, 775; 438/14
See application file for complete search history.

(56) References Cited

U.S. PATENT DOCUMENTS

| | | | |
|---|---|---|---|
| 6,184,048 B1* | 2/2001 | Ramon | 438/14 |
| 7,340,359 B2* | 3/2008 | Erez et al. | 702/81 |
| 7,494,829 B2* | 2/2009 | Subramaniam et al. | 438/14 |

OTHER PUBLICATIONS

Jason Allen Pharis "Outlier model using FMAX to predict failing devices", Texas Tech University, Aug. 2005.*

* cited by examiner

*Primary Examiner* — John H Le
(74) *Attorney, Agent, or Firm* — Williams, Morgan & Amerson, P.C.

(57) ABSTRACT

A method includes performing burn-in testing of a device in a tester to generate post burn-in data. Pre-burn-in data associated with the device is compared to the post burn-in data. The device is identified as an outlier device based on the comparison.

14 Claims, 4 Drawing Sheets

METHOD AND APPARATUS FOR IDENTIFYING OUTLIERS FOLLOWING BURN-IN TESTING

CROSS-REFERENCE TO RELATED APPLICATIONS

Not applicable.

BACKGROUND OF THE INVENTION

The disclosed subject matter relates generally to manufacturing and, more particularly, to a method and apparatus for identifying outliers following burn-in testing.

There is a constant drive within the semiconductor industry to increase the quality, reliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing the defects in the manufacture of the components of a typical transistor also lowers the overall cost per transistor as well as the cost of integrated circuit devices incorporating such transistors.

Generally, a set of processing steps is performed on a wafer using a variety of processing tools, including photolithography steppers, etch tools, deposition tools, polishing tools, rapid thermal processing tools, implantation tools, etc. During the fabrication process various events may take place that affect the performance of the devices being fabricated. That is, variations in the fabrication process steps result in device performance variations. Factors, such as feature critical dimensions, doping levels, contact resistance, particle contamination, etc., all may potentially affect the end performance of the device.

After fabrication of the devices is complete, each wafer is subjected to preliminary functional tests, commonly referred to as final wafer electrical tests (FWET) that evaluate test structures on the wafer and SORT tests that evaluate each die. Wafers that pass these tests are then cut to singulate the individual die, which are then packed in substrates. Packed dies are then subjected to additional tests against the specification of customers' orders to determine performance characteristics such as maximum operating speed, power, caches, etc.

Exemplary tests include initial class tests (ICL) that is a preliminary test for power and speed. ICL testing is usually followed by burn-in (BI) and post burn-in (PBI) tests that test packaged die under specified temperature and/or voltage stress, and automatic test equipment (ATE) tests that test die functionality. Then, packaged dies with different characteristics go through system-level tests (SLT) in which they are tested against customer requirements on specific electrical characteristics. In SLT, packaged dies are tested in an actual motherboard by running system-level tests (e.g., variance test programs). After completion of the testing, the devices are fused, marked, and packed to fill customer orders. This back-end processing is commonly referred to as the test, mark, pack (TMP) process.

Burn-in is a method where an IC device is subjected to stress level operating conditions for the purpose of accelerating early failures that may occur when the IC device is assembled in a product. Burn-in generally involves elevating the temperature of an IC device beyond normal operating conditions and electrically exercising the IC device.

Burn-in testing by stressing a group of IC devices may weed out weak IC devices, but it also weakens the IC devices that do not fail and thus has the potential to reduce the quality of the remaining IC devices. Burn-in may be used to improve the manufacturing process of a particular IC device. During burn-in testing, IC devices are stressed to failure, the failures are analyzed, and the results of the analysis are used to modify the manufacturing process.

Typically, test acceptance criteria are defined for each test program implemented by a tester. These acceptance criteria are hard-coded in the test program and are relatively static due to the cost associated with program revision and configuration control. Some of the devices that undergo burn-in are compromised, but still pass post-burn-in testing based on the acceptance criteria.

However, some compromised devices are likely to fail during subsequent testing or after a short service life once installed in a system. These compromised devices consume valuable testing resources during the remainder of the TMP process and also may increase warranty costs or decrease customer satisfaction due to failures occurring in installed systems.

This section of this document is intended to introduce various aspects of art that may be related to various aspects of the disclosed subject matter described and/or claimed below. This section provides background information to facilitate a better understanding of the various aspects of the disclosed subject matter. It should be understood that the statements in this section of this document are to be read in this light, and not as admissions of prior art. The disclosed subject matter is directed to overcoming, or at least reducing the effects of, one or more of the problems set forth above.

BRIEF SUMMARY OF THE INVENTION

The following presents a simplified summary of the disclosed subject matter in order to provide a basic understanding of some aspects thereof. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

One aspect of the disclosed subject matter is seen in a method that includes performing burn-in testing of a device in a tester to generate post burn-in data. Pre-burn-in data associated with the device is compared to the post burn-in data. The device is identified as an outlier device based on the comparison.

Another aspect of the disclosed subject matter is seen in a method that includes performing burn-in testing of a device in a tester by implementing a test program to generate a data file including post burn-in data. The test program specifies a first set of acceptance criteria for use by the tester in determining if the device is defective. Post burn-in data is extracted from the data file for the device through an entity independent of the tester. The entity determines if the device is an outlier device by evaluating the post burn-in data using a second set of acceptance criteria different from the first set of acceptance criteria. The device is identified as an outlier device in the data file based on the determination by the entity using the second set of acceptance criteria.

BRIEF DESCRIPTION OF THE SEVERAL VIEWS OF THE DRAWINGS

The disclosed subject matter will hereafter be described with reference to the accompanying drawings, wherein like reference numerals denote like elements, and.

Figure 1:
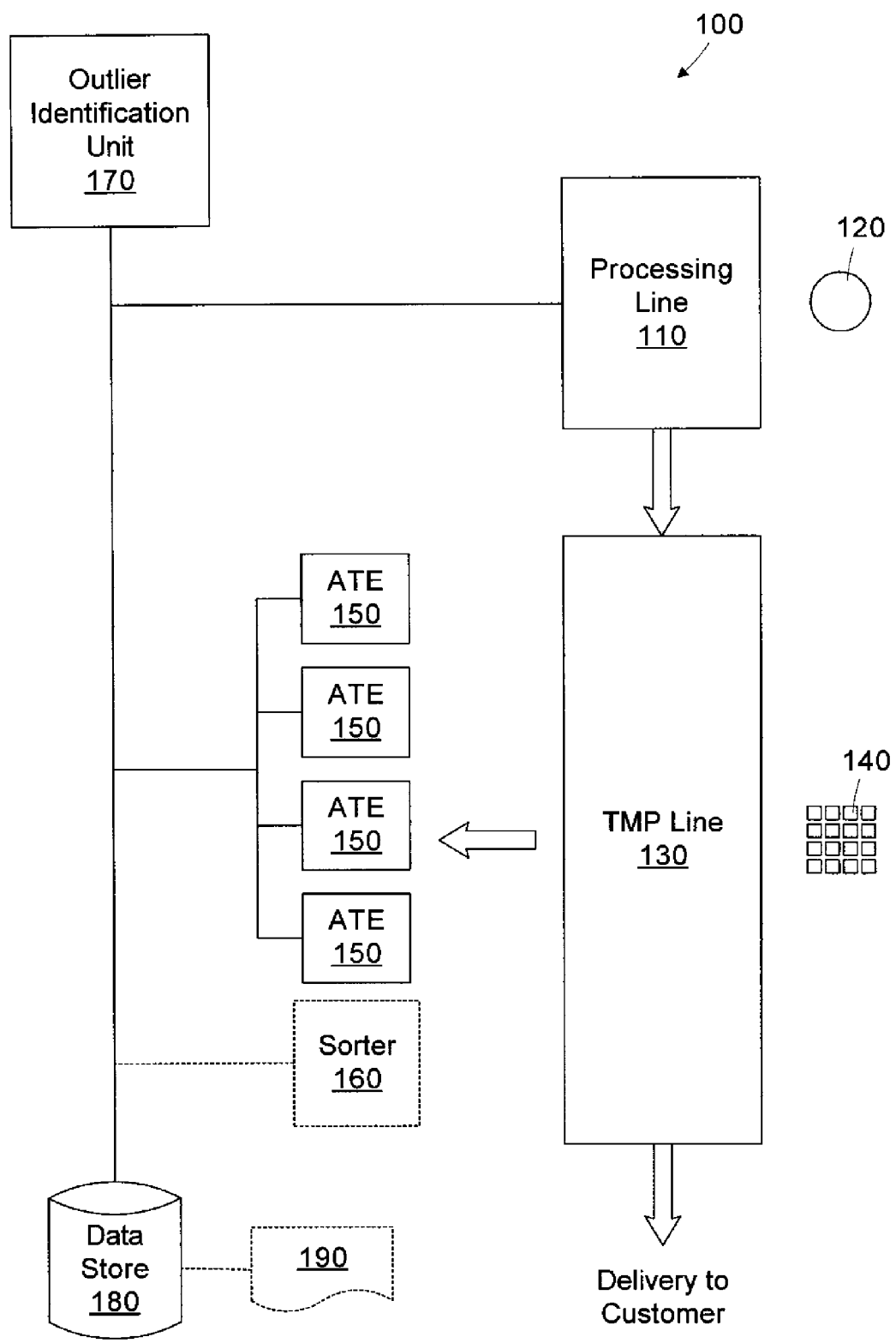
FIG. 1 is a simplified block diagram of a manufacturing system in accordance with one embodiment of the disclosed subject matter.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION OF THE INVENTION

One or more specific embodiments of the disclosed subject matter will be described below. It is specifically intended that the disclosed subject matter not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the disclosed subject matter unless explicitly indicated as being "critical" or "essential."

The disclosed subject matter will now be described with reference to the attached figures. Various structures, systems and devices are schematically depicted in the drawings for purposes of explanation only and so as to not obscure the disclosed subject matter with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Portions of the disclosed subject matter and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "accessing" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices. Note also that the software implemented aspects of the disclosed subject matter are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The disclosed subject matter is not limited by these aspects of any given implementation.

Referring now to the drawings wherein like reference numbers correspond to similar components throughout the several views and, specifically, referring to FIG. 1, the disclosed subject matter shall be described in the context of an illustrative manufacturing system 100. The manufacturing system 100 includes a processing line 110 for fabricating wafers 120, a test, mark, pack (TMP) line 130 for processing devices 140, automated test equipment (ATE) testers 150, a sorter 160, an outlier identification unit 170, and a data store 180.

In the illustrated embodiment, wafers 120 are processed by the processing line 110 to fabricate die thereon. The processing line 110 may include a variety of process tools and/or metrology tools, which may be used to process and/or examine the wafers to fabricate the semiconductor devices. For example, the process tools may include photolithography steppers, etch tools, deposition tools, polishing tools, rapid thermal anneal tools, ion implantation tools, and the like. The process metrology tools may include thickness measurement tools, scatterometers, ellipsometers, scanning electron microscopes, and the like. Techniques for processing the wafers 120 are well known to persons of ordinary skill in the art and therefore will not be discussed in detail herein for clarity and to avoid obscuring the disclosed subject matter. Although a single wafer 120 is pictured in FIG. 1, it is to be understood that the wafer 120 is representative of a single wafer as well as a group of wafers, e.g. all or a portion of a wafer lot that may be processed in the processing line 110.

After the wafers 120 have been processed in the processing line 110 to fabricate the die, certain metrology tools, such as sort or final wafer electrical test (FWET) tools may be employed to collect electrical performance data while the wafer is still uncut. Sort metrology employs a series of probes to electrically contact pads on the completed die to perform electrical and functional tests. For example, a sort metrology tool may measure voltages and/or currents between various nodes and circuits that are formed on the die. Exemplary sort parameters measured include, but are not limited to, clock search parameters, diode characteristics, scan logic voltage, static IDD, VDD min, power supply open short characteristics, and ring oscillator frequency, etc. The particular sort parameters selected may vary depending on the application and the nature of the device formed on the die. Final wafer electrical testing (FWET) entails parametric testing of discrete structures like transistors, capacitors, resistors, interconnects and relatively small and simple circuits, such as ring oscillators. It is intended to provide a quick indication as to whether or not the wafer is within basic manufacturing specification limits. Wafers that exceed these limits are typically discarded so as to not waste subsequent time or resources on them.

After the die on the wafer 120 have completed preliminary testing, the wafers 120 are cut to singulate the die. Each die is then each mounted to a package, resulting in the devices 140. ATE testers 150 in the TMP line 130 then subject the devices 140 to various testing programs to grade the devices and verify full functionality. The protocols used by the testers 150 specify burn-in testing requirements for at least some of the devices 140. Burn-in tests exercise the devices under stressed conditions (e.g., temperature and/or voltage). Post-burn-in (PBI) tests are also performed to measure various characteristics of the devices after burn-in and to determined the continued functionality of the devices 140.

Devices 140 that fail PBI tests using the acceptance criteria defined in the tester 150 program are identified by setting a so-called maverick flag or indicator in the data store 180 indicating a failed device. For example, devices 140 may be grouped into lots (e.g., ~1000 units). A lot data file 190 is generated that contains the test results associated with each device 140 in the lot. Failed devices 140 may be marked by setting a maverick flag in the lot data file 190. Typically, the lot data file 190 remains open until the tests have been completed for the devices 140 in the lot. Once the lot data file 190 is closed, the lot of devices 140 continues through the TMP line 130. Devices 140 having asserted maverick flags are segregated from the flow. These flagged devices 140 may be scrapped or retested and re-binned as a lower performance grade.

After the completion of burn-in testing, the outlier identification unit 170 evaluates PBI data and/or pre-BI data to identify outlier devices. These outlier devices may pass functional tests and the ATE acceptance criteria, but may be more likely to fail during subsequent testing or after a short service life. The outlier identification unit 170 attempts to identify outlier devices to conserve subsequent testing resources and to avoid letting compromised devices be released to customers. An outlier device is generally defined as a device that is expected to have degraded capabilities and/or a short service life.

Due to the nature of the ATE test programs and the need for configuration control, it is difficult and costly to change acceptance criteria for the testers 150. In certain cases, a customer may request more stringent acceptance criteria than the normal test program specifies. The outlier identification unit 170 may use dynamic acceptance criteria that impose different criteria than the testers 150. These different acceptance criteria may be more stringent or may consider different or additional variables. For instance, testers 150 use data collected for the current test run (i.e., commonly referred to as an insertion) for evaluating in light of the acceptance criteria. As the outlier identification unit 170 is not tied to a specific tester 150 or program, it may use previously gathered data (i.e., pre-BI data) to compare to the PBI data collected at the current insertion. Because the outlier identification unit 170 operates on current and/or previous insertion data that has already been collected and stored, it can identify additional outliers without substantial impact on the throughput of the manufacturing system 100.

In a first embodiment, the outlier identification unit 170 interfaces with the sorter 160 to facilitate the PBI data analysis. In the manufacturing system, the sorter 160 may be used for other purposes, such as program development, validation, hardware debugging, fuse characterization, fusing, etc. Generally, the sorter 160 is a low-cost device sorting system designed to facilitate high unit-per-hour sorting without requiring the expense of full function tester 150. The sorter 160 includes a camera to identify the identity of a scanned device 140 and interface with the outlier identification unit 170 to communicate its identity. Although the sorter 160 and outlier identification unit 170 are illustrated as separate entities, their functionalities may be performed by a single host computer. For example, the sorter 160 may include an interface board for receiving the devices 140 that communicates with a host computer to perform the various tasks described. Outlier rejection may be one of the tasks performed by the host computer.

In another embodiment, the outlier identification unit 170 operates as a "virtual" outlier rejection system in that its functionality is accomplished using software executing on a computer without interfacing with a hardware unit, such as the sorter 160. As the sorter 160 in this embodiment is optional, the sorter 160 is shown in phantom in FIG. 1.

Generally, the outlier identification unit 170 accesses the lot data file 190 to gather PBI data associated with the devices 140 in the lot. In embodiments where the sorter 160 is employed this review may be triggered as each device in the lot is interfaced with the sorter 160 and identified. In virtual embodiments, the outlier identification unit 170 may be invoked prior to the closing of the lot data file 190 to perform outlier rejection on the devices 140 in the lot based on the data in the lot data file 190. The outlier identification unit 170 may also gather test data from previous insertions from the data store 180 based on the identity of the device being analyzed.

In some embodiments, the outlier identification unit 170 may employ univariate statistical analysis of one or more device parameters that are measured prior to BI, such as during SORT testing or a previous insertion. In other embodiments, a multivariate model (e.g., principal component analysis, k-nearest neighbor, etc.) may be used that considers contributions from multiple device parameters. For purpose of the following illustrations, a univariate statistical approach is described.

The particular parameters selected for outlier evaluation may vary depending on the particular implementation and the particular type of device being manufactured. In the case where pre-BI data is compared to PBI data, the outlier identification unit 170 selects certain device parameters that are typically stable across different testing cycles. For example, parameters such as Vddmin, thermsense ranges, diode ideality, static Idd, etc. are typically measured during preliminary SORT tests and/or previous insertions and should remain stable after BI testing if the devices 140 are not compromised. The outlier identification unit 170 may also perform outlier screening using only PBI data, such as AC capacitance, static Idd, junction temperature, and casing temperature. These exemplary parameters are not intended to be exhaustive or limiting with respect to the embodiments described herein.

The outlier identification unit 170 evaluates Pre-BI and/or PBI data for one or more of the selected parameters to identify outlier devices. In some cases, the data necessary for the outlier may be contained in the lot data file 190. In other cases, the outlier identification unit 170 may extract other required data from the data store 180 related to the devices 140 collected during previous insertions or testing procedures. The outlier identification unit 170 may only perform additional outlier screens for a subset of the devices that have not already been flagged as being mavericks, thereby reducing the number of screens that need to be performed for a given lot data file 190.

Figure 2:
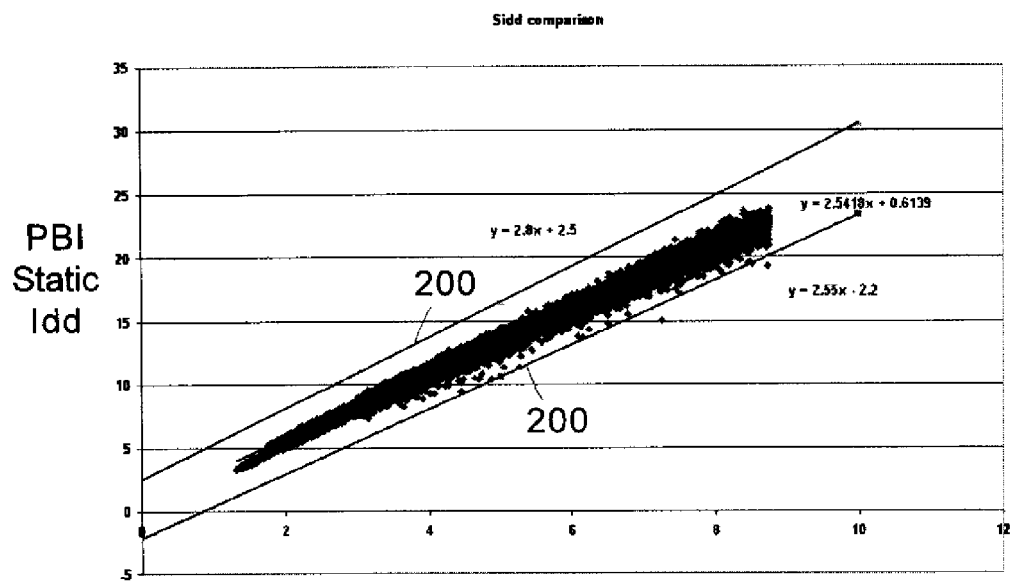
FIGS. 2-5 are curves illustrating outlier screens that may be employed by the outlier identification unit of FIG. 1.
Figure 3:
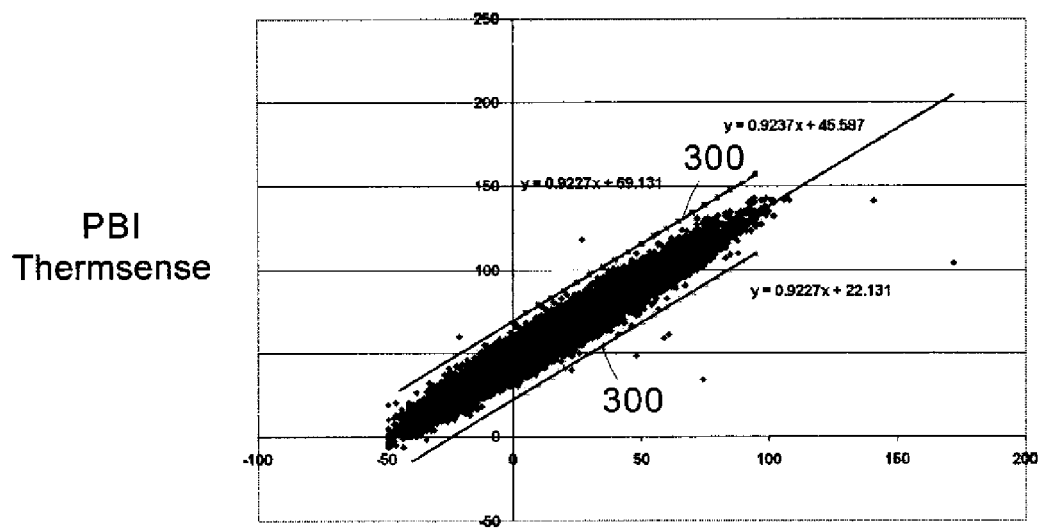

Turning now to FIGS. 2-5, various curves are illustrated that show how the outlier identification unit 170 may use PBI data to identify outliers. In FIGS. 2 and 3, the outlier identification unit 170 compares pre-BI and PBI data, while in FIGS. 4 and 5, the outlier identification unit 170 employs PBI data from a single insertion. In FIG. 2, the outlier identification unit 170 static compares static Idd at sort (i.e., pre-BI) and PBI to thresholds 200 to identify outliers. Changes in these values indicate that the device may be compromised. FIG. 3 illustrates a comparison between thermsense values at sort and PBI using thresholds 300. Again, as these parameters should typically remain stable, changes are indicative of the device being compromised.

Figure 4:
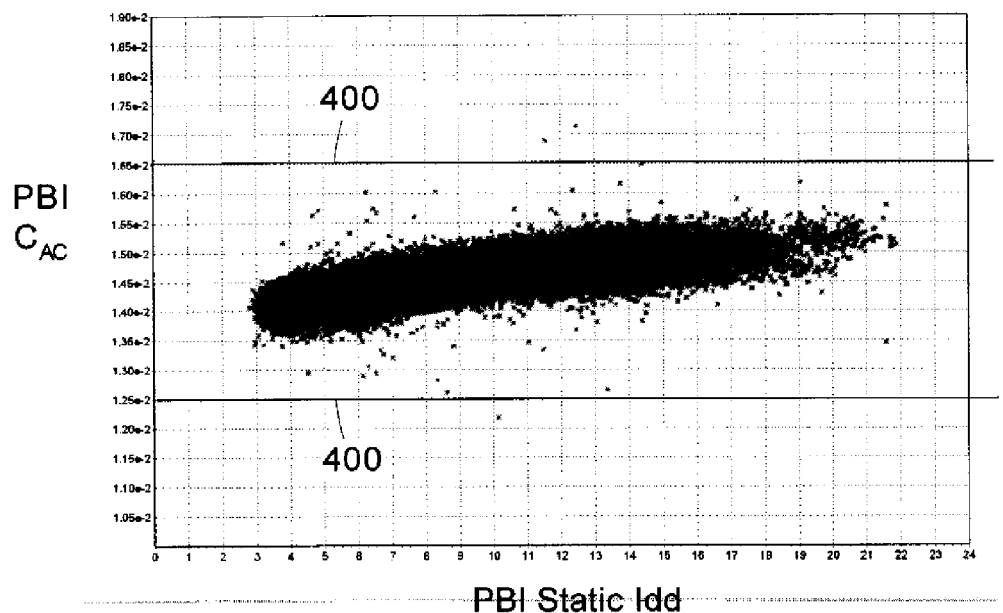
Figure 5:
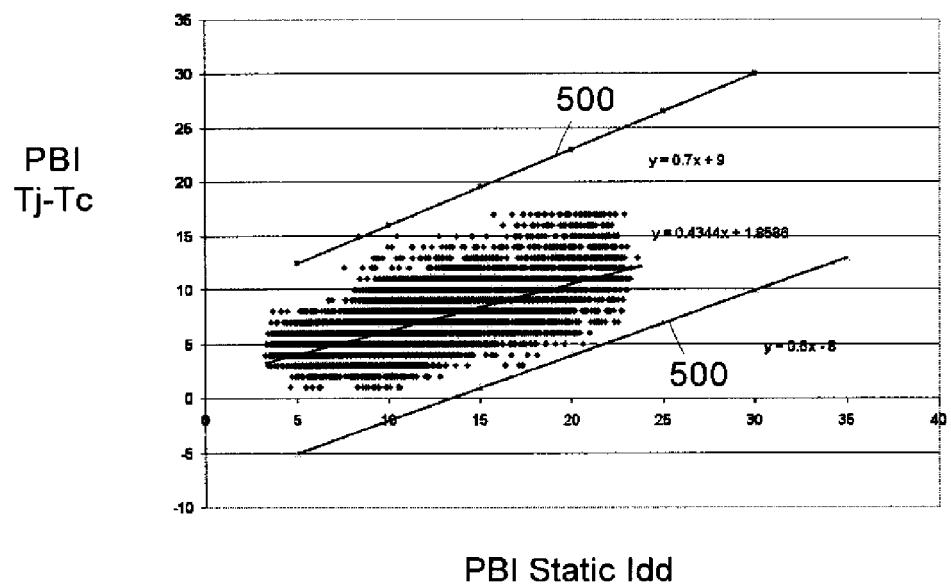

In FIG. 4, the outlier identification unit 170 evaluates PBI Idd versus PBI AC capacitance using thresholds 400, and in FIG. 5, PBI static Idd is compared to the difference between junction temperature (Tj) and case temperature (Tc) using thresholds 500. For uncompromised devices, these parameters should follow known relationships. Devices that do not follow these expected patterns may be compromised.

The screening examples provided in FIGS. 2-5 are intended to be exemplary, not limiting. Other variables, such as Sort Vddmin and PBI Vddmin may also be used for screening outliers, although not illustrated.

Generally, the outlier identification unit 170 performs a plurality of outlier screens using multiple parameters. By using PBI and/or pre-BI screening, alternate acceptance criteria may be specified without requiring reprogramming of the testers 150, thereby increasing flexibility and decreasing cost without sacrificing throughput. Moreover, acceptance criteria may be tailored to specific customer requests without affecting other devices not subjected to these requests. If a particular device fails one or more of the outlier screens employed by the outlier identification unit 170, the outlier identification unit 170 sets the maverick flag in the lot data file 190. Subsequently, after all of the data is collected and screened for outliers, the lot data file 190 may be closed. Devices that had been designated as outliers by the outlier identification unit 170 may be removed from the lot at the next insertion using established TMP procedures as if they had been identified as being defective by the ATE tester 150.

Figure 6:
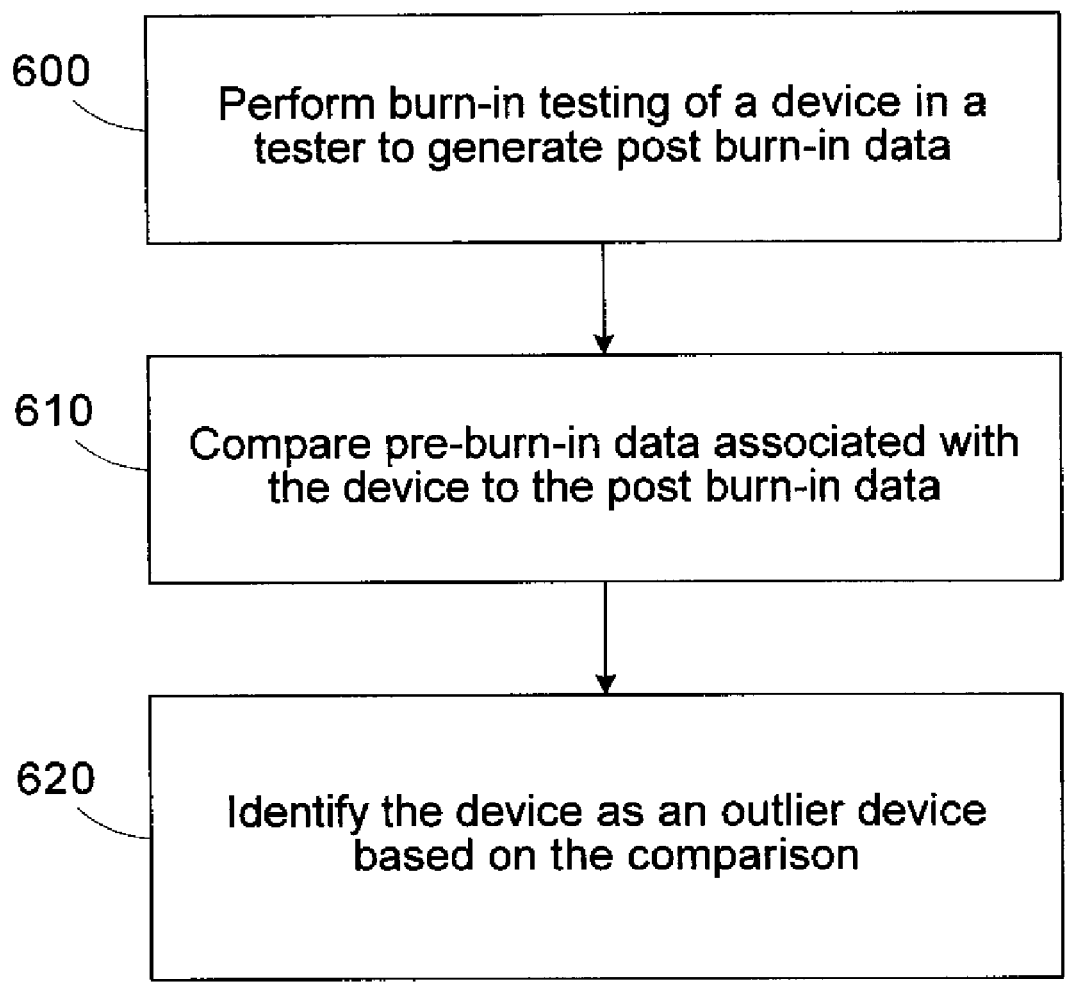
FIG. 6 is a simplified flow diagram of a method for identifying outliers following burn-in testing in accordance with another illustrative embodiment of the disclosed subject matter.

Turning now to FIG. 6, a simplified flow diagram of a method for identifying outliers following burn-in testing in accordance with another illustrative embodiment of the disclosed subject matter is provided. In method block 600, burn-in testing of a device is performed in a tester to generate post burn-in data. In method block 610, pre-burn-in data associated with the device is compared to the post burn-in data. In method block 620, the device is identified as an outlier device based on the comparison.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:

1. A method, comprising:
   interfacing a device in a sorter to determine its identity; and
   in a computing device,
   retrieving pre-burn-in data and post burn-in data associated with the device responsive to determining the identity, wherein retrieving the post burn-in data comprises extracting the post burn-in data associated with the device from a data file generated by a tester;
   comparing pre-burn-in data associated with the device to the post burn-in data; and
   identifying the device as an outlier device based on the comparison.

2. The method of claim 1, further comprising scrapping the outlier device.

3. The method of claim 1, further comprising changing a performance grade of the outlier device.

4. The method of claim 1, wherein the tester has a first set of acceptance criteria for determining if the device is an outlier device, and comparing the pre-burn-in data to the post burn-in data comprises comparing the pre-burn-in data to the post burn-in data using a second set of acceptance criteria different from the first set of acceptance criteria.

5. The method of claim 1, further comprising comparing the pre-burn-in data and the post burn-in data using a predetermined threshold.

6. The method of claim 1, wherein the pre-burn-in data and the post burn-in data comprise at least one of static current data, thermsense data, capacitance data, voltage data, or temperature data.

7. A system, comprising:
   means for interfacing a device in a sorter to determine its identity;
   means for retrieving pre-burn-in data and post burn-in data associated with the device responsive to determining the identity, wherein retrieving the post burn-in data comprises extracting the post burn-in data associated with the device from a data file generated by a tester;
   means for comparing pre-burn-in data associated with the device to the post burn-in data; and
   means for identifying the device as an outlier device based on the comparison.

8. A method, comprising:
   in a computing device,
   extracting post burn-in data associated with a associated with a plurality of devices from a data file generated by at least one tester;
   retrieving pre-burn-in data for at least a subset of the devices;
   comparing the pre-burn-in data associated with the devices in the subset to the post burn-in data; and
   identifying devices in the subset as outlier devices based on the comparisons.

9. The method of claim 8, further comprising scrapping the outlier devices.

10. The method of claim 8, further comprising changing a performance grade of the outlier devices.

11. The method of claim 8, wherein the tester has a first set of acceptance criteria for determining if a particular device is an outlier device, and comparing the pre-burn-in data to the post burn-in data comprises comparing the pre-burn-in data to the post burn-in data using a second set of acceptance criteria different from the first set of acceptance criteria.

12. The method of claim 8, further comprising comparing the pre-burn-in data and the post burn-in data using a predetermined threshold.

13. The method of claim 8, wherein the pre-burn-in data and the post burn-in data comprise at least one of static current data, thermsense data, capacitance data, voltage data, or temperature data.

14. A system, comprising:

means for extracting post burn-in data associated with a associated with a plurality of devices from a data file generated by at least one tester;

means for retrieving pre-burn-in data for at least a subset of the devices;

means for comparing the pre-burn-in data associated with the devices in the subset to the post burn-in data; and means for identifying devices in the subset as outlier devices based on the comparisons.

* * * * *